US009999170B2

(12) United States Patent
Iwata et al.

(10) Patent No.: US 9,999,170 B2
(45) Date of Patent: Jun. 12, 2018

(54) ELECTRONIC COMPONENT MOUNTING METHOD

(71) Applicant: PANASONIC INTELLECTUAL PROPERTY MANAGEMENT CO., LTD., Osaka (JP)

(72) Inventors: Isato Iwata, Aichi (JP); Takuya Yamazaki, Yamanashi (JP); Hirokazu Takehara, Yamanashi (JP); Hiraki Sagara, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 249 days.

(21) Appl. No.: 14/629,664

(22) Filed: Feb. 24, 2015

(65) Prior Publication Data

US 2015/0245497 A1 Aug. 27, 2015

(30) Foreign Application Priority Data

Feb. 24, 2014 (JP) .................................. 2014-032685

(51) Int. Cl.
*H05K 3/30* (2006.01)
*H05K 13/04* (2006.01)
*H05K 13/02* (2006.01)

(52) U.S. Cl.
CPC ....... *H05K 13/0434* (2013.01); *H05K 13/021* (2013.01); *Y10T 29/4913* (2015.01); *Y10T 29/53174* (2015.01)

(58) Field of Classification Search
CPC ................ H05K 13/04; Y10T 29/4913; Y10T 29/53174
See application file for complete search history.

(56) References Cited

U.S. PATENT DOCUMENTS 4,621,967 A * 11/1986 Masada .................. H05K 13/04
198/580
5,201,415 A * 4/1993 Metz .................... H05K 9/0067
206/707

(Continued)

FOREIGN PATENT DOCUMENTS

CN 101385409 A 3/2009
JP H10-261893 A 9/1998

(Continued)

OTHER PUBLICATIONS

Chinese Office Action issued in Chinese Patent Application No. 201510087028.8 dated Jan. 30, 2018.

*Primary Examiner* — Minh Trinh
(74) *Attorney, Agent, or Firm* — Pearne & Gordon LLP

(57) ABSTRACT

Electronic component mounting method for mounting an electronic component on a plurality of board types includes: placing, on tray holding shelves, trays storing components for first and second board types, respectively; recognizing on which tray holding shelf the tray is placed by reading identification information from the trays. The method further includes: rearranging the trays in the tray feeder to a first tray arrangement adapted for the first board type, based on recognized placement position of the tray and the first tray arrangement data, before start of production of the board of the first board type; and rearranging the trays in the tray feeder to a second tray arrangement adapted for the second board type, based on the second tray arrangement data, before start of production of the board of the second board type.

2 Claims, 15 Drawing Sheets

(56) References Cited

U.S. PATENT DOCUMENTS

| | | | |
|---|---|---|---|
| 6,199,272 B1 * | 3/2001 | Seto | H05K 13/021 |
| | | | 29/740 |
| 9,332,230 B2 * | 5/2016 | Hachiya | H04N 7/18 |
| 9,474,194 B2 * | 10/2016 | Kawase | H05K 13/0452 |
| 2009/0064489 A1 | 3/2009 | Inoue et al. | |
| 2015/0245497 A1 * | 8/2015 | Iwata | H05K 13/04 |
| | | | 29/832 |

FOREIGN PATENT DOCUMENTS

| | | |
|---|---|---|
| JP | 2010-098134 A | 4/2010 |
| JP | 2011-091350 A | 5/2011 |

* cited by examiner

FIG. 5A

FIRST TRAY ARRANGEMENT DATA — 55

| ADDRESS NO. | TRAY IDENTIFICATION INFORMATION |
|---|---|
| 01 | AA |
| 02 | BB |
| 03 | CC |
| 04 | DD |
| 05 | EE |
| 06 | FF |
| 07 | GG |
| 08 | HH |

SECOND TRAY ARRANGEMENT DATA — 56

| ADDRESS NO. | TRAY IDENTIFICATION INFORMATION |
|---|---|
| 01 | FF |
| 02 | GG |
| 03 | AA |
| 04 | HH |
| 05 | EE |
| 06 | CC |
| 07 | BB |
| 08 | DD |

COMBINATION DATA BEFORE START OF
PRODUCTION OF FIRST BOARD TYPE

| ADDRESS NO. | TRAY IDENTIFICATION INFORMATION |
|---|---|
| 00 | |
| 01 | AA |
| 02 | CC |
| 03 | DD |
| 04 | BB |
| 05 | EE |
| 06 | GG |
| 07 | FF |
| 08 | HH |

COMBINATION DATA BEFORE START OF
PRODUCTION OF SECOND BOARD TYPE

| ADDRESS NO. | TRAY IDENTIFICATION INFORMATION |
|---|---|
| 00 | |
| 01 | AA |
| 02 | BB |
| 03 | CC |
| 04 | DD |
| 05 | EE |
| 06 | FF |
| 07 | GG |
| 08 | HH |

57

ELECTRONIC COMPONENT MOUNTING METHOD

BACKGROUND

1. Technical Field

One or more aspects of the present invention relates to an electronic component mounting method and an electronic component mounting apparatus for mounting an electronic component on a board.

2. Background Art

In the field of electronic component mounting, a tray feeder is known as a kind of parts feeder that supplies an electronic component. The tray feeder is provided with: a magazine (tray container) having, in a vertical direction, a plurality of slots (tray holding shelves) where a pallet holding a tray storing an electronic component is placed; and moving means for drawing out the pallet from the slot onto a pallet drawing out table (tray holding stage) and moving it to a component supply position where the electronic component is supplied to a mounting head provided in the electronic component mounting apparatus. As such a tray feeder, to adapt to the production of a plurality of board types, a tray feeder using a plurality of magazines have been proposed (for example, see JP-A-2011-91350).

An example shown in JP-A-2011-91350 shows a tray feeder where a main magazine and a sub magazine are disposed one above the other. In this tray feeder, trays storing components to be mounted on a board type being currently produced are accommodated in the main magazine, whereas trays storing components to be mounted on a board type to be produced next are accommodated in the sub magazine. In the board type changeover work, a tray holding an electronic component not to be mounted on the board type to be produced next is taken out from the main magazine together with the pallet, and is drawn out onto the pallet drawing out table. Then, the drawn-out tray is placed in an empty slot of the sub magazine, and a tray storing an electronic component to be mounted on the board type to be produced next is drawn out from the sub magazine onto the pallet drawing out table. Then, the drawn-out tray is placed in the empty slot of the main magazine. Thereby, the time required for the tray exchange between the magazines can be reduced.

SUMMARY

However, in the above-described conventional tray feeder, since a tray storing a component to be mounted on the board type to be produced next is placed in order from an empty slot of the main magazine that becomes empty by shifting, to the sub magazine, a tray storing a component not to be mounted on the board type to be produced next, the tray arrangement in the magazine is not always a suitable one for the production of the board type to be produced next, and this is a cause to reduce productivity.

An object of one or more aspects of the present invention is to provide an electronic component mounting method and an electronic component mounting apparatus capable of improving productivity by realizing the most suitable tray arrangement according to a plurality of board types.

In one aspect of the present invention, there is provided an electronic component mounting method for mounting an electronic component on a plurality of board types including at least a first board type and a second board type in an electronic component mounting apparatus that includes: a tray feeder including a tray container including a plurality of tray holding shelves arranged in a vertical direction and each holding a tray storing an electronic component; and an electronic component mounting unit that mounts the electronic component supplied from the tray feeder, on a board, said electronic component mounting method including: placing, on the tray holding shelves, a plurality of trays each storing an electronic component to be mounted on a board belonging to the first board type and a plurality of trays each storing an electronic component to be mounted on a board belonging to the second board type; recognizing on which tray holding shelf the tray is placed, by reading identification information from a recording medium provided in each of the trays held on the tray holding shelves; rearranging the trays in the tray feeder to a first tray arrangement corresponding to first tray arrangement data adapted for production of the board belonging to the first board type, based on recognized placement position of the tray and the first tray arrangement data, before start of production of the board belonging to the first board type; and rearranging the trays in the tray feeder to a second tray arrangement corresponding to second tray arrangement data adapted for production of the board belonging to the second board type, based on the second tray arrangement data, before start of production of the board belonging to the second board type.

In another aspect of the present invention, there is provided an electronic component mounting apparatus including: a plurality of trays each storing an electronic component; a recording medium provided in each of the trays and recording identification information for identifying each of the trays; a tray feeder including a tray container including a plurality of tray holding shelves which is arranged in a vertical direction and which holds the trays; an electronic component mounting unit which mounts the electronic component supplied from the tray feeder on a board; a tray moving unit which includes a tray out/in mechanism that moves the tray in a horizontal direction to draw out the tray from the tray holding shelf and to place the tray on the tray holding shelf, and which moves the tray to a position where the electronic component stored on the tray drawn out by the tray out/in mechanism can be supplied to the electronic component mounting unit; a tray placement position recognition unit which recognizes on which tray holding shelf the tray is placed, by reading the identification information from the recording medium provided in each of the trays held on the tray holding shelves; and a tray rearrangement unit which rearranges the trays in the tray feeder to a first tray arrangement corresponding to first tray arrangement data adapted for production of the board belonging to the first board type before start of production of a board belonging to a first board type based on a placement position of the tray recognized by the tray placement position recognition unit, and which rearranges the trays in the tray feeder to a second tray arrangement corresponding to second tray arrangement data adapted for production of the board belonging to the second board type before start of production of a board belonging to a second board type.

According to one or more aspects of the present invention, the number of times of placement of the trays in the tray feeder by the operator can be reduced and the most suitable tray arrangement can be realized according to a plurality of board types, so that productivity can be improved.

BRIEF DESCRIPTION OF THE DRAWINGS

FIG. 5A is a view showing first tray arrangement data according to the embodiment of the present invention, and FIG. 5B is a view showing second tray arrangement data according to the embodiment of the present invention;

FIGS. 6A and 6B are views showing combination data according to the embodiment of the present invention;

DETAILED DESCRIPTION

Figure 1:
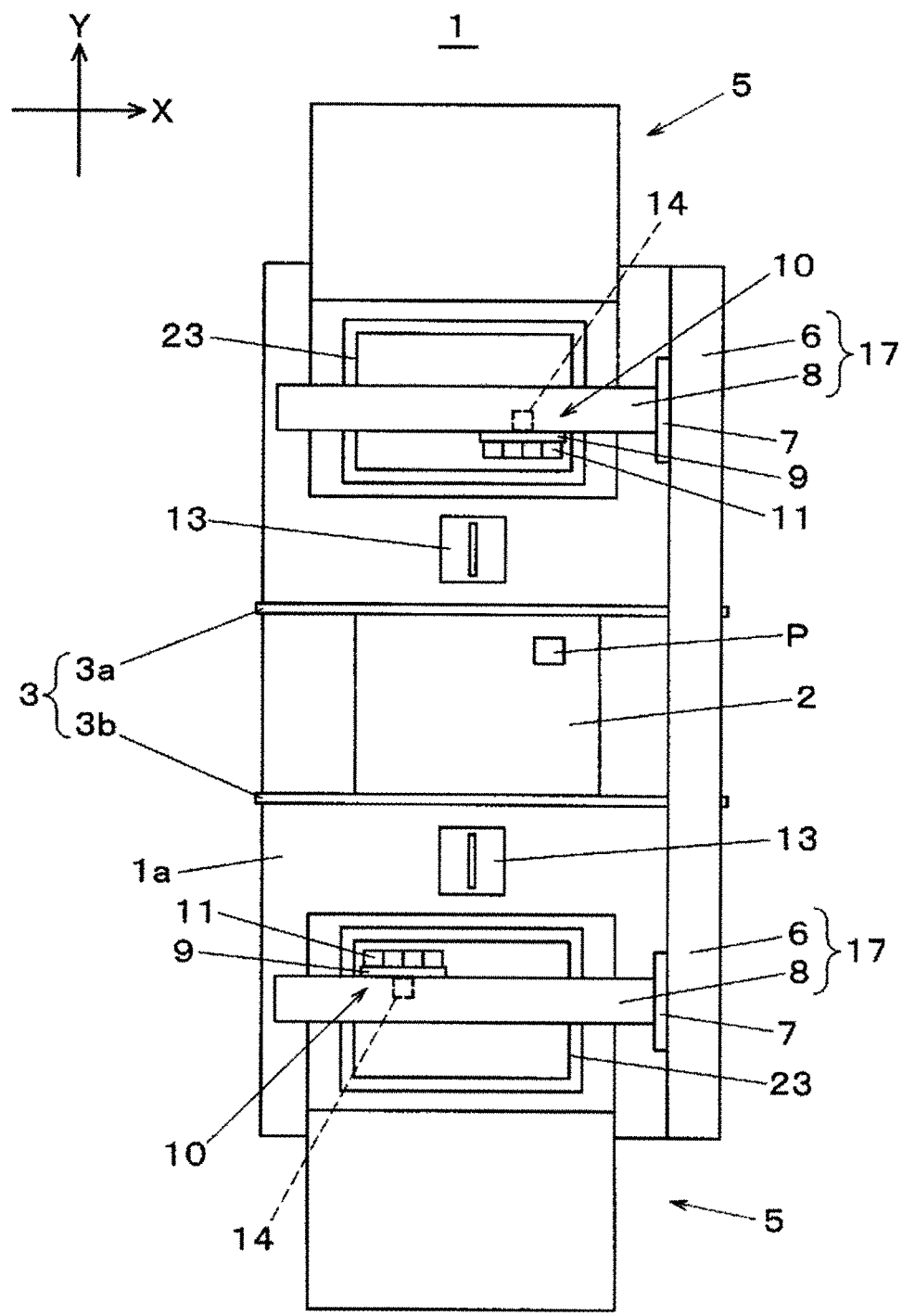
FIG. 1 is a plan view of an electronic component mounting apparatus according to an embodiment of the present invention.

First, referring to FIG. 1, an electronic component mounting apparatus according to an embodiment of the present invention will be described. The electronic component mounting apparatus 1 has the function of mounting an electronic component P on a board 2, and has a structure in which elements described below are covered with a cover member 1b (FIG. 2). In a central part of a base 1a, a carrier conveyer 3 is disposed. The carrier conveyer 3 is formed of a combination of a fixed rail 3a and a movable rail 3b extending in an X direction which is a board conveyance direction. By driving a conveyer belt provided in each rail by a belt driving mechanism 15 (FIG. 4), the board 2 can be conveyed and positioned in a predetermined mounting work position. The movable rail 3b is movable in a Y direction orthogonal to the X direction within a horizontal plane, and by driving a rail width adjusting mechanism 16 (FIG. 4), the movable rail 3b moves in the Y direction. Thereby, the conveyance width defined by the distance between the fixed rail 3a and the movable rail 3b can be adjusted according to the board type to be produced.

A tray feeder 5 is provided on each side of the carrier conveyer 3. The tray feeder 5 functions as a component supply unit that supplies a large size electronic component P such as a BGA or a CSP in a state of being stored on a tray 23, to a mounting head 10 included in an electronic component mounting unit described later.

On one end portion of the base 1a in the X direction, a Y-axis table 6 having a linear driving mechanism is disposed horizontally to the Y direction, and on this Y-axis table 6, two brackets 7 are attached so as to be slidable in the Y direction. To the brackets 7, two X-axis tables 8 each having a linear driving mechanism like the Y-axis table 6 are coupled. On each X-axis table 8, a bracket 9 is attached so as to be slidable in the X direction, and to each bracket 9, the mounting head 10 is attached.

Figure 2:
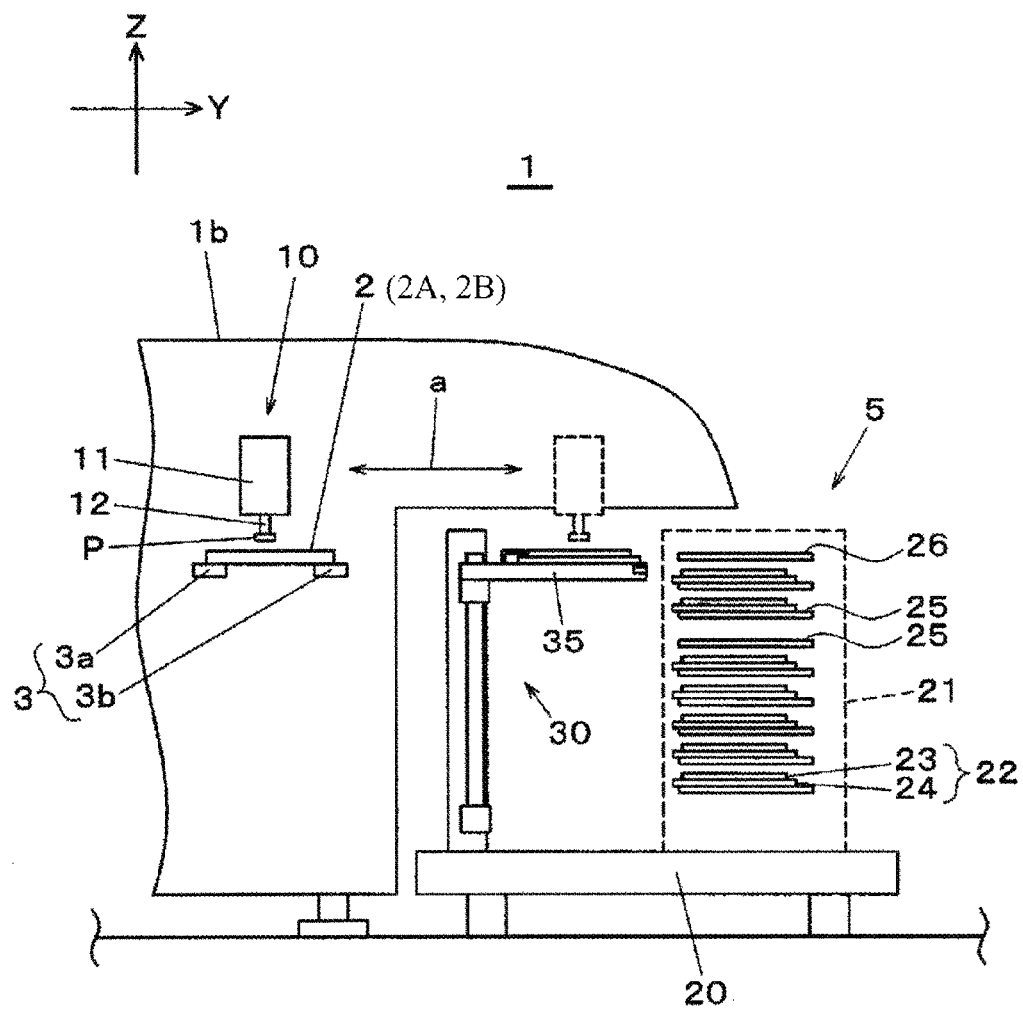
FIG. 2 is a partial side view of the electronic component mounting apparatus according to the embodiment of the present invention.

In FIGS. 1 and 2, the mounting head 10 is a multiple head having a plurality of unit mounting heads 11, and on the lower end portion of each unit mounting head 11, a suction nozzle 12 capable of sucking the electronic component P is attached. The suction nozzle 12 is moved up and down by a nozzle lifting mechanism 18 (FIG. 4) incorporated in the mounting head 10. By driving the Y-axis table 6 and the X-axis table 8, the mounting head 10 moves in the X and Y directions, whereby the unit mounting heads 11 take out the electronic component P from the tray feeder 5 and mount it on the board 2 positioned in the mounting work position (the arrow a shown in FIG. 2). The Y-axis table 6, the X-axis table 8 and the mounting head 10 constitute the electronic component mounting unit that mounts the electronic component P supplied from the tray feeder 5 on the board 2. Moreover, the Y-axis table 6 and the X-axis table 8 constitute a head moving mechanism 17 (FIG. 4) that horizontally moves the mounting head 10.

A component recognition camera 13 is provided between the tray feeder 5 and the carrier conveyer 3. The component recognition camera 13 images from below the electronic component P in a state of being taken out from the tray feeder 5 and held by the mounting head 10. Each bracket 9 is provided with a board recognition camera 14 situated on the lower surface side of the X-axis table 8. The board recognition camera 14 moves integrally with the mounting head 10, and images the board 2 from above.

Figure 3:
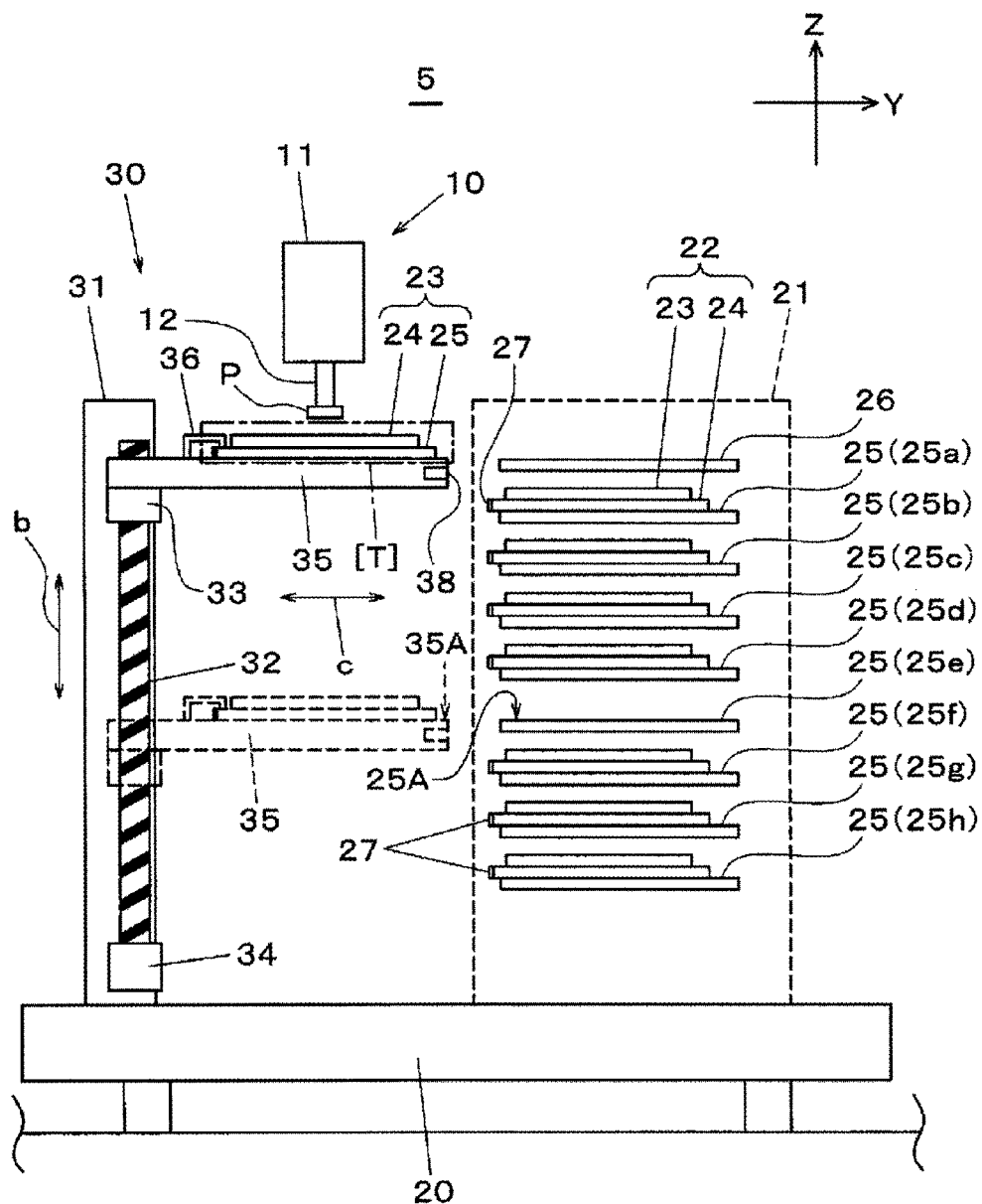
FIG. 3 is a side view of a tray feeder according to the embodiment of the present invention.

Next, referring to FIGS. 2 and 3, the structure of the tray feeder 5 will be described. A tray container 21 is disposed on one side of a base portion 20. Inside the tray container 21, a plurality of tray holding shelves 25a, 25b, 25c, 25d, 25e, 25f, 25g and 25h on each of which a carrier 22 is placed so that it can be drawn out in the horizontal direction are provided in the vertical direction (FIG. 3). The tray holding shelves 25a to 25h are assigned with address numbers 01, 02, 03, 04, 05, 06, 07 and 08, respectively. For convenience, in the following description, the tray holding shelves 25a to 25h will be referred to as tray holding shelf 25 except when it is necessary to distinguish them from one another in explaining them.

The carrier 22 includes the tray 23 storing the electronic component P and a pallet 24 holding the tray 23. The tray 23 is moved within the tray feeder 5 in a state of being held on the pallet 24 by a tray moving unit 30 described later. By storing the carriers 22 on the plurality of tray holding shelves 25, a plurality of trays 23 are held on the tray holding shelves 25 through the pallets 24. As described above, the tray feeder 5 has the tray container 21 having, in the vertical direction, a plurality of tray holding shelves 25 each holding the tray 23.

Above the uppermost tray holding shelf 25a, a temporary tray placement shelf 26 is provided. The temporary tray placement shelf 26 is a shelf for temporarily placing an empty tray 23 where the number of electronic components P has become zero and a tray 23 in the work of rearrangement of the trays 23 described later. The temporary tray placement shelf 26 is assigned with an address number 00.

In FIG. 3, on a side surface of the pallet 24, an IC tag 27 recording identification information for identifying the tray 23 held on the pallet 24 is provided. The IC tag 27 is provided for each of the trays 23 held on the pallets 24. The identification information recorded on the IC tag 27 includes information such as the kind, the ID number and the like of the electronic component P stored on the tray 23. As described above, the IC tag 27 is a recording medium provided for each tray 23 and recording identification information for identifying the tray 23. The IC tag 27 may be provided on a side surface of the tray 23.

In FIG. 3, on the other side on the base portion 20 where the tray container 21 is not disposed, a Z-axis table 31 extending in the vertical direction (Z direction) is provided. The Z-axis table 31 is provided with a feed screw 32 extending in the Z direction, a movable nut 33 screwed with this, and a lifting motor 34 that rotates the feed screw 32. To the movable nut 33, a tray holding stage 35 capable of holding the carrier 22 including the tray 23 is fixed. When the feed screw 32 rotates about the vertical axis by the driving by the lifting motor 34, the tray holding stage 35 moves up and down (arrow b) together with the movable nut 33. Thereby, the tray 23 can be moved to a position where the electronic component P stored on the tray 23 can be taken out by the mounting head 10, that is, the component supply position [T] where the electronic component P can be supplied to the electronic component mounting unit.

On the tray holding stage 35, an engagement member 36 that is engageable with the pallet 24 is provided so as to be slidable in the horizontal direction (arrow c). The engagement member 36 slides by a slide mechanism 37 (FIG. 4) incorporated in the tray holding stage 35. In the operation of drawing out the tray 23 to the tray holding shelf 25, the height of the upper surface 25A of the tray holding shelf 25 and the height of the upper surface 35A of the tray holding stage 35 are made to coincide with each other. Under this condition, the engagement member 36 is slid toward the tray container 21, and the engagement member 36 is engaged with the pallet 24. Then, the engagement member 36 is slid in a direction away from the tray container 21, whereby the carrier 22 is drawn out from the tray container 21 and moved onto the tray holding stage 35. When the carrier 22 on the tray holding stage 35 is placed on the tray holding shelf 25, an operation reverse to the above-described one is executed.

As described above, the tray holding stage 35, the engagement member 36 and the slide mechanism 37 constitute a tray out/in mechanism that draws out the tray 23 from the tray holding shelf 25 and places the tray 23 on the tray holding shelf 25 by moving the tray 23 in the horizontal direction. The Z-axis table 31 having the feed screw 32, the movable nut 33 and the lifting motor 34 serves as a lifting mechanism that moves the tray holding stage 35 in the vertical direction with respect to the tray container 21. A combination of the tray out/in mechanism and the lifting mechanism constitutes the tray moving unit 30 for moving the tray 23 to the position where the electronic component P stored on the tray 23 drawn out by the tray out/in mechanism can be supplied to the electronic component mounting unit.

In FIG. 3, on the side of the tray holding stage 35 opposed to the tray container 21, a tag reader 38 serving as a reading unit which reads the identification information of the tray 23 recorded on the IC tag 27 is attached. The carrier 22 is placed on the tray holding shelf 25 so that the IC tag 27 is situated on the side opposed to the tag reader 38. By disposing the tag reader 38 and the IC tag 27 of the carrier 22 placed on the tray holding shelf 25 so as to be opposed to each other, the tag reader 38 reads the identification information of the tray 23 from the IC tag 27.

Figure 4:
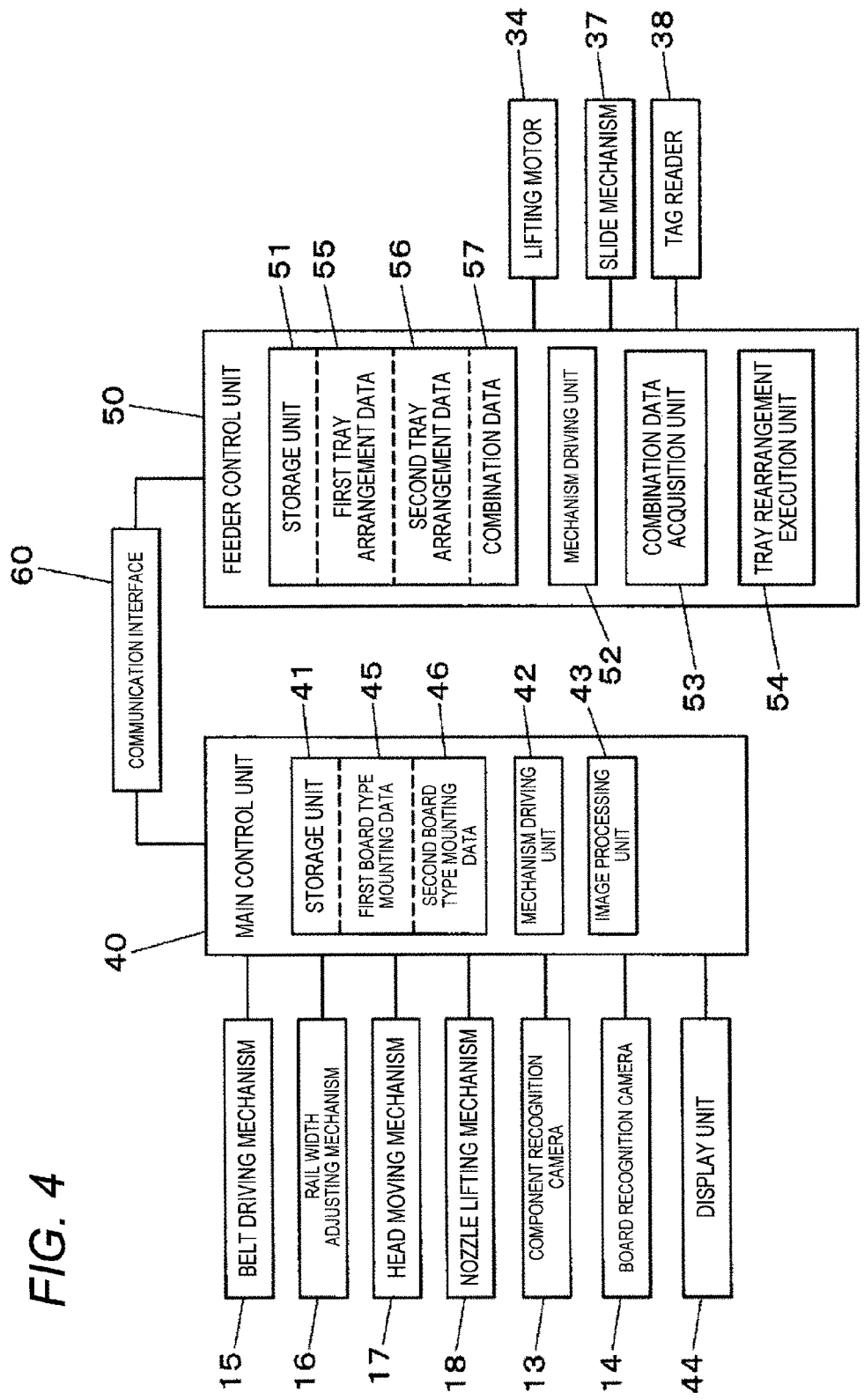
FIG. 4 is a block diagram showing a control system of the electronic component mounting apparatus according to the embodiment of the present invention.

Next, referring to FIG. 4, the control system of the electronic component mounting apparatus 1 will be described. In the electronic component mounting apparatus 1, the apparatus main unit and the tray feeder 5 are each provided with an individual control unit. A main control unit 40 provided in the apparatus main unit has a storage unit 41, a mechanism driving unit 42 and an image processing unit 43. Moreover, the main control unit 40 is connected to the belt driving mechanism 15, the rail width adjusting mechanism 16, the head moving mechanism 17, the nozzle lifting mechanism 18, the component recognition camera 13, the board recognition camera 14 and a display unit 44.

A feeder control unit 50 provided in the tray feeder 5 has a storage unit 51, a mechanism driving unit 52, a combination data acquisition unit 53 and a tray rearrangement execution unit 54. Moreover, the feeder control unit 50 is connected to the lifting motor 34, the slide mechanism 37 and the tag reader 38. The main control unit 40 and the feeder control unit 50 are connected through a communication interface 60 so that they can communicate with each other.

The storage unit 41 of the main control unit 40 stores first board type mounting data 45 and second board type mounting data 46. The first board type mounting data 45 is data for mounting the electronic component P on the board 2 belonging to a first board type. The second board type mounting data 46 is data for mounting the electronic component P on the board 2 belonging to a second board type. Hereinafter, the board 2 belonging to the first board type will be referred to as "board 2A", and the board 2 belonging to the second board type will be referred to as "board 2B".

The mechanism driving unit 42 drives the belt driving mechanism 15, the rail width adjusting mechanism 16, the head moving mechanism 17 and the nozzle lifting mechanism 18 based on the first board type mounting data 45 or the second board type mounting data 46 to thereby execute the operation to take out the electronic component P from the tray feeder 5 and mount it on the board 2A or 2B.

The image processing unit 43 processes the imaging data acquired by the component recognition camera 13 to thereby detect the position of the electronic component P sucked by the suction nozzle 12. Moreover, the image processing unit 43 processes the imaging data acquired by the board recognition camera 14 to thereby detect the position of the board 2A or 2B positioned in the mounting work position. The positioning of the suction nozzle 12 with respect to the board 2A or 2B in the horizontal direction is performed in consideration of the position gap amount acquired by detecting the positions of the board 2A or 2B and the electronic component P. The display unit 44 is formed of a display device such as a monitor, and displays various pieces of information related to the production of the boards 2A and 2B by the display processing function of the main control unit 40 or the feeder control unit 50.

The storage unit 51 of the feeder control unit 50 stores first tray arrangement data 55, second tray arrangement data 56 and combination data 57. As shown in FIGS. 5A and 5B, the first tray arrangement data 55 and the second tray arrangement data 56 are each a combination of an address number (01, 02, . . . , 08) of the tray holding shelf 25 and the identification information (AA, BB, . . . , HH) of the tray 23. These pieces of tray arrangement data record the arrangement information of the trays 23 storing the electronic components P to be mounted on both or either of the boards 2A and 2B. The boards 2A and 2B are produced under a condition where the trays 23 are placed on the predetermined tray holding shelves 25 according to the first tray arrangement data 55 and the second tray arrangement data 56, respectively.

The first tray arrangement data 55 contains arrangement data A1 of the tray 23 storing the electronic component P to be mounted on the board 2A and arrangement data A2 of the tray 23 storing the electronic component P not to be mounted on the board 2A but to be mounted on the board 2B. Likewise, the second tray arrangement data 56 contains arrangement data B1 of the tray 23 storing the electronic component P to be mounted on the board 2B and arrangement data B2 of the tray 23 storing the electronic component P not to be mounted on the board 2B but to be mounted on the board 2A.

The first tray arrangement data 55 and the second tray arrangement data 56 are determined from the viewpoint of the operational efficiency of the mounting on the boards 2A and 2B. For example, it is determined based on a criterion such that the first tray arrangement data 55 (second tray arrangement data 56) is held by a tray holding shelf 25 close to the component supply position [T] for the tray 23 storing the electronic component P highly frequently mounted on the board 2A (board 2B) and is held by a lower tray holding shelf 25 for the tray 23 storing the electronic component P not to be mounted on the board 2A (board 2B).

As described above, the first tray arrangement data 55 is data adapted for the production of the board 2A belonging to the first board type, and indicates the most suitable tray arrangement for the production of the board 2A. Moreover, the second tray arrangement data 56 is data adapted for the production of the board 2B belonging toe the second board type, and indicates the most suitable tray arrangement for the production of the board 2B. These pieces of tray arrangement data are prepared before the start of production of the boards 2A and 2B.

The combination data 57 is, as shown in FIG. 6, a combination of the address number of the temporary tray placement shelf 26 or the tray holding shelf 25 and the identification information of the tray 23 actually placed on the tray holding shelf 25 corresponding to the address number. The combination data 57 is acquired by executing the combination data acquisition unit 53.

The mechanism driving unit 52 drives the lifting motor 34 and the slide mechanism 37 based on the first board type mounting data 45 or the second board type mounting data 46 to thereby execute an operation to take out a desired tray 23 from the tray container 21 and move it to the component supply position [T]. The mechanism driving unit 52 also performs an operation to return the drawn-out tray 23 to the tray holding shelf 25.

The combination data acquisition unit 53 combines the identification information of the tray 23 read by the tag reader 38 and the address number of the tray holding shelf 25, and acquires this as the combination data 57. By referring to the combination data 57, the feeder control unit 50 can recognize on which tray holding shelf 25 each tray 23 is held. As described above, the tag reader 38 and the combination data acquisition unit 53 serve as a tray placement position recognition unit which recognizes on which tray holding shelf 25 each tray 23 is placed by reading the identification information of the trays 23 from the recording medium provided in the trays 23 held on a plurality of tray holding shelves 25. The acquired combination data 57 is stored in the storage unit 51.

Before the start of production of the board 2A belonging to the first board type, the tray rearrangement execution unit 54 rearranges the trays 23 so that the combination of the address number of the tray holding shelf 25 and the identification information of the tray 23 indicated by the combination data 57 coincides with the combination of the address number of the tray holding shelf 25 and the identification information of the tray 23 indicated by the first tray arrangement data 55. Before the start of production of the board 2A belonging to the first board type indicates before the start of mounting of the electronic component P on, of a plurality of boards 2A belonging to the first board type, the board 2A produced first.

Moreover, before the start of production of the board 2B belonging to the second board type, the tray rearrangement execution unit 54 rearranges the trays 23 so that the combination of the address number of the tray holding shelf 25 and the identification information of the tray 23 indicated by the combination data 57 coincides with the combination of the address number of the tray holding shelf 25 and the identification information of the tray 23 indicated by the second tray arrangement data 56. Before the start of production of the board 2B belonging to the second board type indicates before the start of mounting of the electronic component P on, of a plurality of boards 2B belonging to the second board type, the board 2B produced first.

As described above, the tray rearrangement execution unit 54 serves as a tray rearrangement unit which rearranges the trays in the tray feeder 5 to the tray arrangement corresponding to the first tray arrangement data 55, prepared in advance, adapted for the production of the board 2A belonging to the first board type based on the placement position of the tray 23 recognized by the tray placement position recognition unit before the start of production of the board 2A belonging to the first board type, and rearranging the trays in the tray feeder 5 to the tray arrangement corresponding to the second tray arrangement data 56, prepared in advance, adapted for the production of the board 2B belonging to the second board type before the start of production of the board 2B belonging to the second board type.

Figure 7:
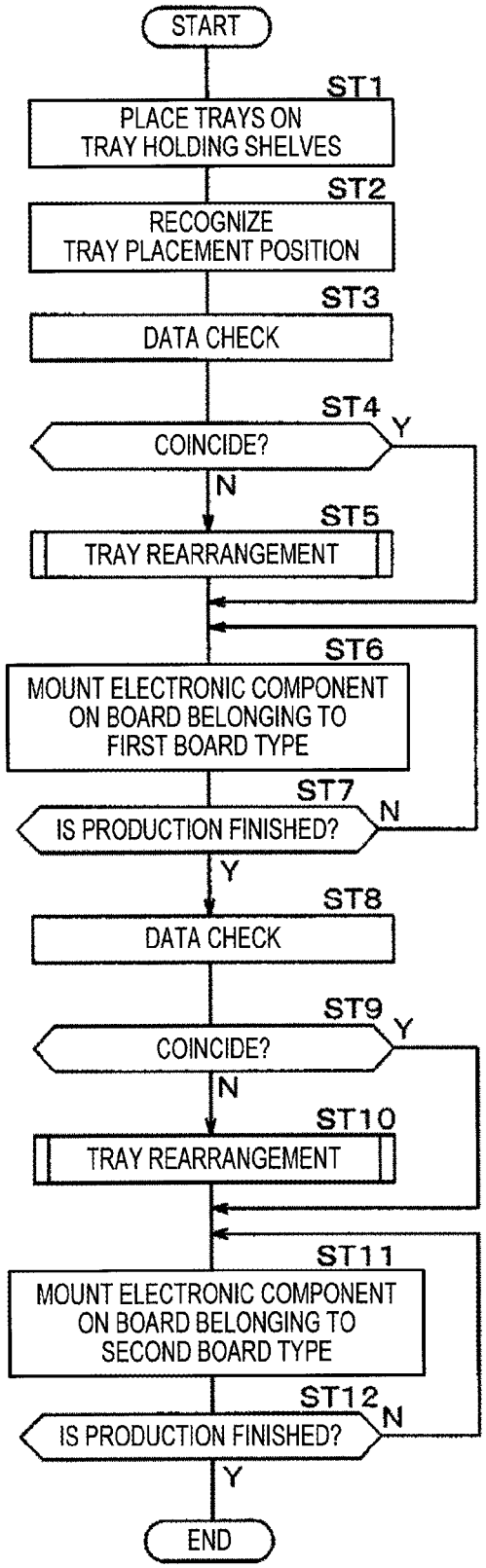
FIG. 7 is a flowchart of an electronic component mounting method according to the embodiment of the present invention.
Figure 8:
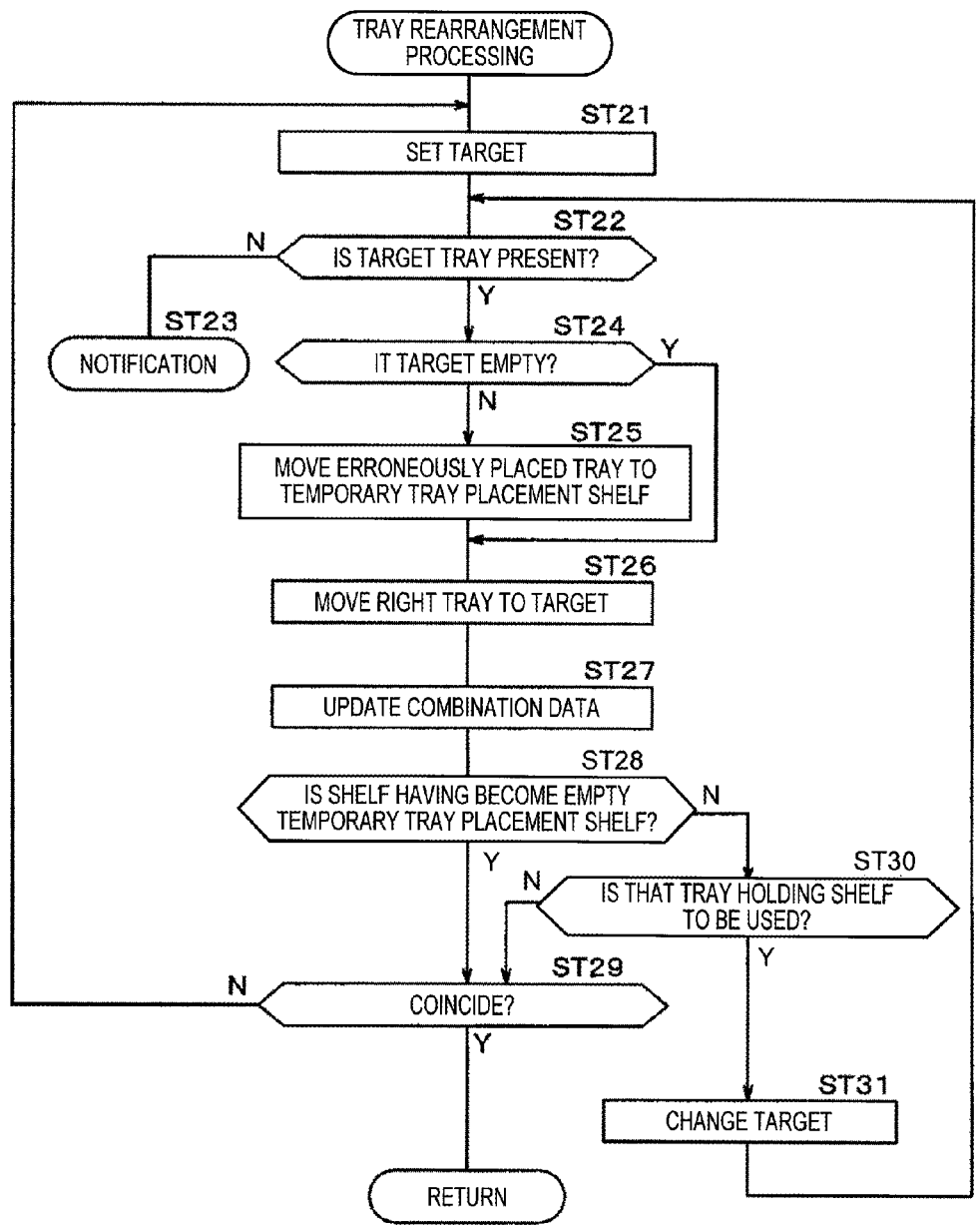
FIG. 8 is a flowchart of tray rearrangement processing according to the embodiment of the present invention.

The electronic component mounting apparatus 1 according to the present embodiment is structured as described above, and next, an electronic component mounting method for mounting the electronic component P on a plurality of board types will be described with reference to the flowcharts of FIGS. 7 and 8. In this example, production is performed in the order of the board 2A and the board 2B. The carrier 22 having the IC tag 27 recording the identification information AA will be referred to as a carrier 22a, the carrier having the IC tag 27 recording the identification information BB will be referred to as a carrier 22b, . . . , and the carrier having the IC tag 27 recording the identification information HH will be referred to as a carrier 22h.

First, the operator places, on the tray holding shelves 25, a plurality of trays 23 each storing the electronic component P to be mounted on the board 2A belonging to the first board type and a plurality of trays 23 each storing the electronic component P to be mounted on the board 2B belonging to the second board type (ST1: tray placement step). At this time, the operator may randomly places the trays 23. The trays 23 are placed on the tray holding shelves 25 in a state of being held on the pallets 24, that is, as one element of the carrier 22.

Figure 9A:
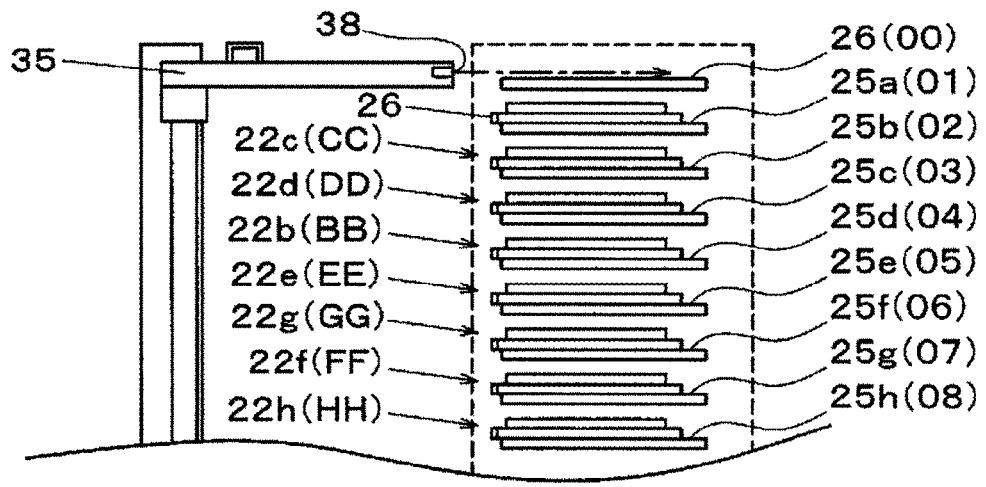
FIGS. 9A and 9B are explanatory views of a tray rearrangement operation according to the embodiment of the present invention.
Figure 9B:
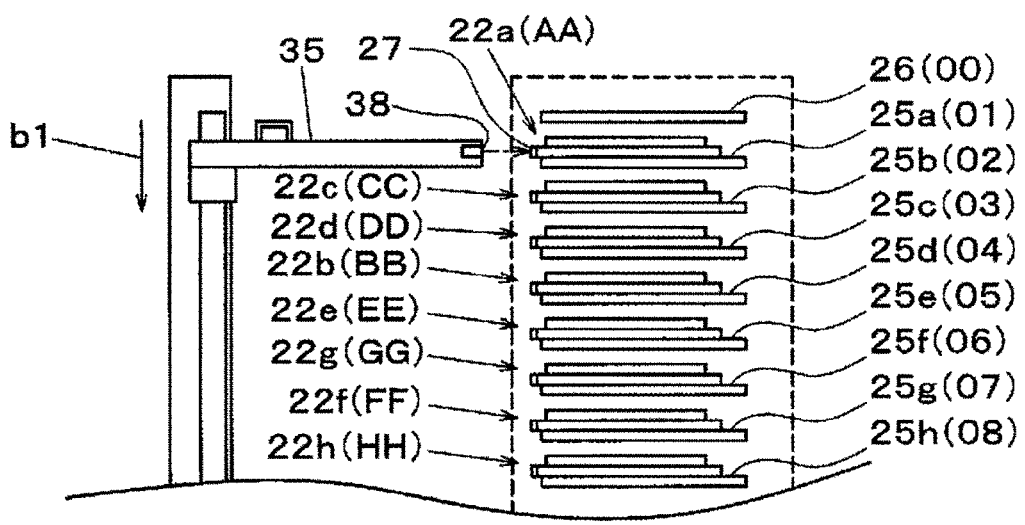

Then, the placement position of the tray 23 is recognized (ST2: tray placement position recognition step). In the present embodiment, the recognition is performed based on the combination data 57. Referring to FIGS. 9A and 9B, the work of acquisition of the combination data 57 will be described. First, as shown in FIG. 9A, the tray holding stage 35 moves to the position opposed to the temporary tray placement shelf 26. Then, the tag reader 38 executes the operation to read the identification information of the tray 23 from the IC tag 27. When no carrier 22 is held on the temporary tray placement shelf 26, the feeder control unit 50 determines that the identification information of the tray 23 that can be combined with the address number 00 of the temporary tray placement shelf 26 is absent. On the other hand, when the carrier 22 is held on the temporary tray placement shelf 26, the feeder control unit 50 combines the address number 00 of the temporary tray placement shelf 26 with the identification information of the tray 23 read from the IC tag 27. The reason why the reading operation by the tag reader 38 is performed on the temporary tray placement shelf 26 is that there is a possibility that the operator erroneously places the tray 23 on the temporary tray placement shelf 26 in the work of placement of the tray 23.

Then, as shown in FIG. 9B, the tray holding stage 35 moves down to the position opposed to the carrier 22a placed on the tray holding shelf 25a (arrow b1). Then, the tag reader 38 reads the identification information AA of the tray 23 from the IC tag 27 of the carrier 22a. Then, the feeder control unit 50 combines the address number 01 of the tray holding shelf 25a with the read identification information AA of the tray 23. Thereafter, this operation is repetitively performed up to the lowermost tray holding shelf 25h, thereby acquiring the combination data 57 shown in FIG. 6A.

By referring to the acquired combination data 57, the feeder control unit 50 recognizes on which tray holding shelf 25 each tray 23 is placed. That is, at this step, on which tray holding shelf 25 each tray 23 is placed is recognized by reading the identification information from the recording medium provided in each of the trays 23 held on a plurality of tray holding shelves 25. The method of recognizing the placement positions of the trays 23 is not limited to the method of performing it based on the combination data 57, and a different method may be used.

Then, the feeder control unit 50 checks the combination data 57 and the first tray arrangement data 55 against each other (ST3: first check step), and determines whether the combination data 57 coincides with the first tray arrangement data 55 or not (ST4: first combination data determination step). This determination is performed based on whether the combination of the address number of the tray holding shelf 25 and the identification information of the tray 23 indicated by the combination data 57 coincides with the combination of the address number of the tray holding shelf 25 and the identification information of the tray 23 indicated by the first tray arrangement data 55 or not.

When it is determined at (ST4) that the combination data 57 does not coincide, the feeder control unit 50 rearranges the trays 23 so that the combination data 57 coincides with the first tray arrangement data 55 (ST5: first tray rearrangement step). In this example, the pieces of identification information of the trays 23 to be combined with the address numbers 02, 03, 04, 06 and 07 are different from the first tray arrangement data 55 (FIG. 5A, FIG. 6A).

Now, referring to the flowchart of FIG. 8, the processing to rearrange the trays 23 will be described. First, the feeder control unit 50 sets, as the target, the tray holding shelf 25 (when there is more than one, one of them) on which rearrangement is to be performed (ST21: target setting step). In this example, of the tray holding shelves 25b, 25c, 25d, 25f and 25g on which rearrangement is to be performed, the uppermost tray holding shelf 25b is set as the first target.

Then, it is determined whether or not the tray 23 to be placed on the tray holding shelf 25b is placed on another tray holding shelf 25 or the temporary tray placement shelf 26 (ST22: tray presence or absence determination step). Specifically, referring to the combination data 57, the feeder control unit 50 searches for the carrier 22b having the IC tag 27 recording the identification information BB of the tray 23 to be combined with the address number 02. When the carrier 22b is not found, the feeder control unit 50 notifies the operator of the occurrence of an error through the display unit 44 (ST23: notification step).

On the other hand, when the carrier 22b is found, the feeder control unit 50 checks if the tray holding shelf 25b as the target is empty or not (ST24: target check step). In this example, the carrier 22b is erroneously placed on the tray holding shelf 25d, and the carrier 22c is erroneously placed on the tray holding shelf 25b.

Figure 10A:
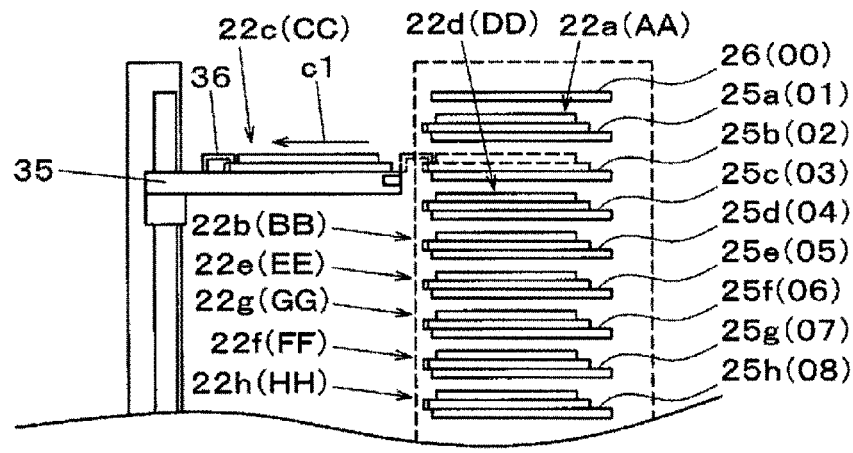
FIGS. 10A, 10B and 10C are explanatory views of the tray rearrangement operation according to the embodiment of the present invention.
Figure 10B:
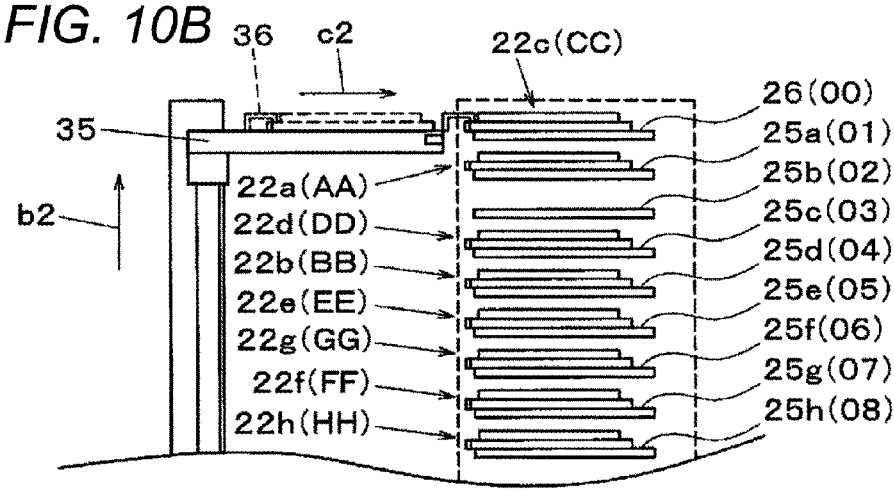

When it is determined that the target is not empty, the tray 23 erroneously placed on the target is moved to the temporary tray placement shelf 26 (ST25: erroneously placed tray moving step). That is, as shown in FIG. 10A, the tray holding stage 35 moves to the position opposed to the tray holding shelf 25b. Then, the carrier 22c is drawn out from the tray holding shelf 25b by the engagement member 36 and moved to the tray holding stage 35 (arrow c1). Then, as shown in FIG. 10B, the tray holding stage 35 moves to the position opposed to the temporary tray placement shelf 26 (arrow b2), and the carrier 22c is moved to the temporary tray placement shelf 26 by the engagement member 36 (arrow c2).

Figure 10C:
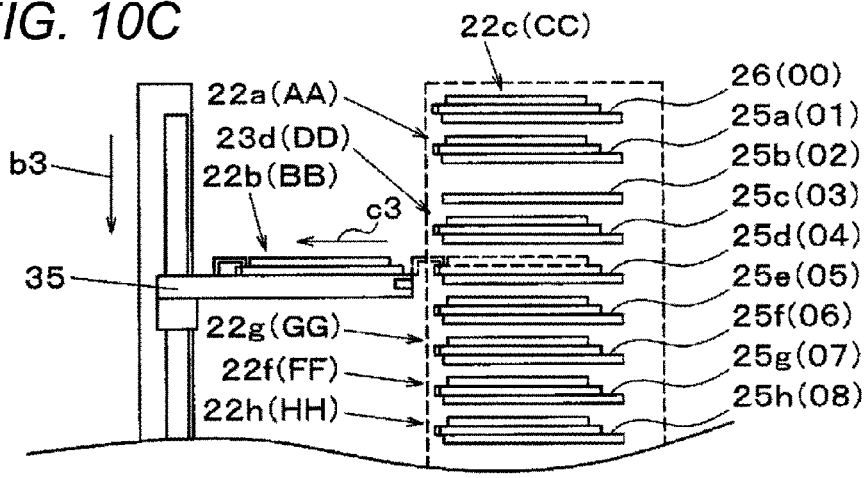
Figure 11A:
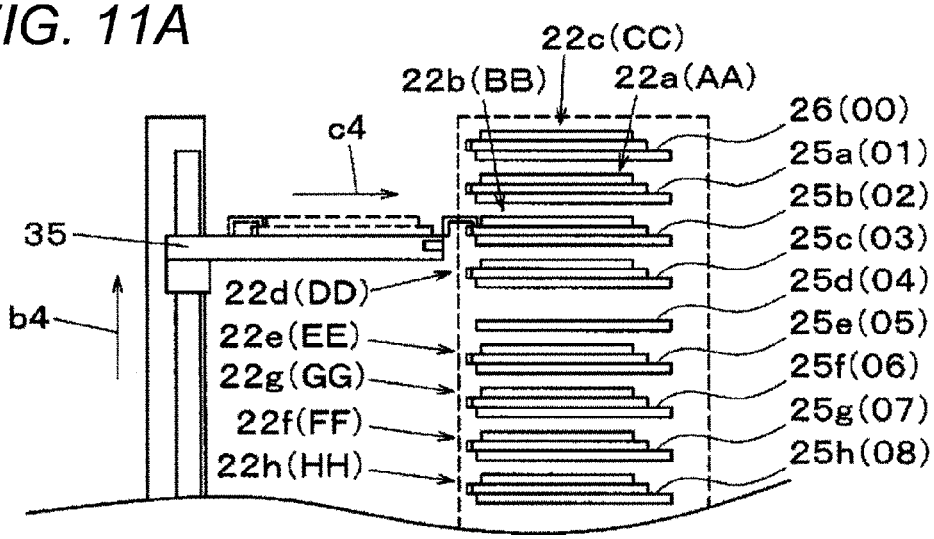
FIGS. 11A, 11B and 11C are explanatory views of the tray rearrangement operation according to the embodiment of the present invention.

Then, the right tray 23 to be placed on the target is moved (ST26: right tray moving step). That is, as shown in FIG. 10C, the tray holding stage 35 moves to the position opposed to the tray holding shelf 25d as the target (arrow b3), and the carrier 22b is drawn out from the tray holding shelf 25d by the engagement member 36 (arrow c3). Then, as shown in FIG. 11A, the tray holding stage 35 moves to the position opposed to the tray holding shelf 25b (arrow b4), and the carrier 22b is moved to the tray holding shelf 25b by the engagement member 36 (arrow c4).

By executing the above-described steps (ST25) and (ST26), the rearrangement of the trays 23 on one target is completed. On the tray holding shelf 25b with the address number 02, the right tray 23 corresponding to the identification information BB is placed. When it is determined at (ST24) that the tray holding shelf 25b is empty, the movement of the tray 23 to the temporary tray placement shelf 26 is omitted (ST25), and the movement of the right tray 23 is executed (ST26).

Then, the feeder control unit 50 updates the combination data 57 (ST27: combination data update step). That is, the feeder control unit 50 performs an edit so that the information indicated by the combination data 57 is the combination of the address number of the tray holding shelf 25 and the identification information of the tray 23 after the rearrangement of the trays 23.

Then, the feeder control unit 50 determines whether the shelf that has become empty by the carrier 22b being drawn out therefrom is the temporary tray placement shelf 26 or the tray holding shelf 25 (ST28: shelf kind determination step). When it is determined that the shelf having become empty is the temporary tray placement shelf 26, the feeder control unit 50 determines whether the updated combination data 57 coincides with the first tray arrangement data 55 or not (ST29: updated combination data determination step). When it is determined that the combination data 57 does not coincide, the process returns to (ST21) and the target is set.

When it is determined at (ST28) that the shelf having become empty is the tray holding shelf 25, the feeder control unit 50 determines whether that tray holding shelf 25 is to be used for the production of the board 2A or not (ST30: use determination step). This determination is performed based on whether the identification information of the tray 23 to be combined with the address number of the tray holding shelf 25 is present or not. When it is determined that the tray holding shelf 25 having become empty is to be used, the feeder control unit 50 changes the target to that tray holding shelf 25 (ST31: target change step), and then, the process returns to (ST22).

On the other hand, when it is determined that the tray holding shelf 25 having become empty is not to be used, the feeder control unit 50 determines whether the updated combination data 57 coincides with the first tray arrangement data 55 or not (ST29). When it is determined that the combination data 57 does not coincide, the process returns to (ST21) and the target is set.

When it is determined at (ST29) that the updated combination data 57 coincides with the first tray arrangement data 55, the feeder control unit 50 ends the tray rearrangement processing. As described above, at the first tray rearrangement step (ST5), before the start of production of the board 2A belonging to the first board type, the trays 23 in the tray feeder 5 are rearranged to the tray arrangement corresponding to the first tray arrangement data 55 based on the placement position of the tray 23 recognized at the tray placement position recognition step (ST2) and the first tray arrangement data 55, prepared in advance, adapted for the production of the board 2A belonging to the first board type.

Figure 11B:
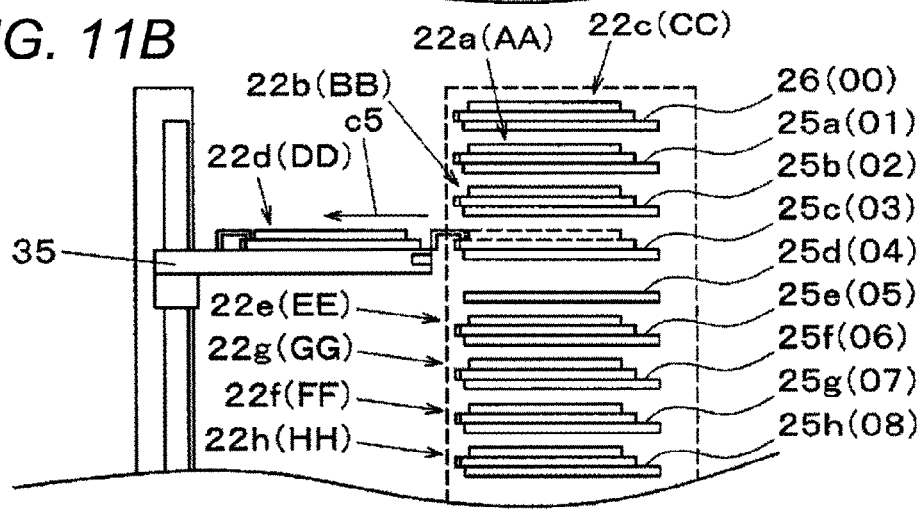
Figure 11C:
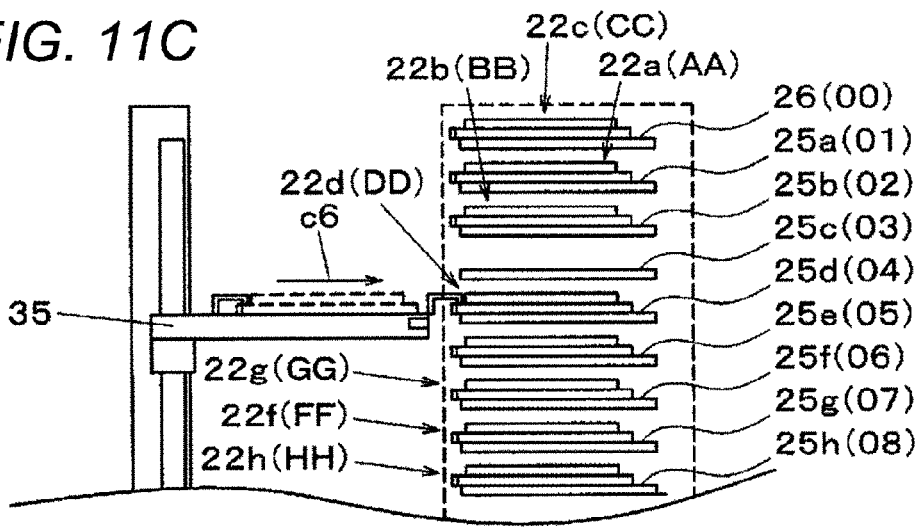
Figure 12A:
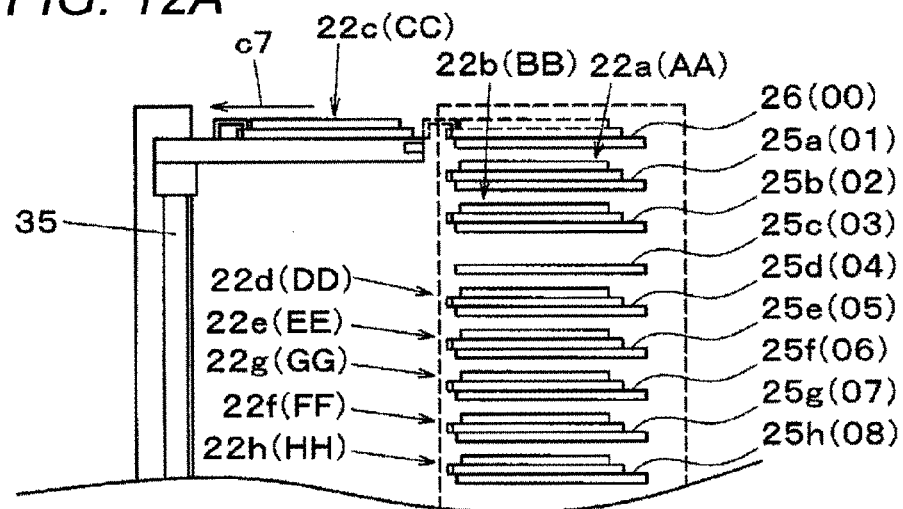
FIGS. 12A, 12B and 12C are explanatory views of the tray rearrangement operation according to the embodiment of the present invention.
Figure 12B:
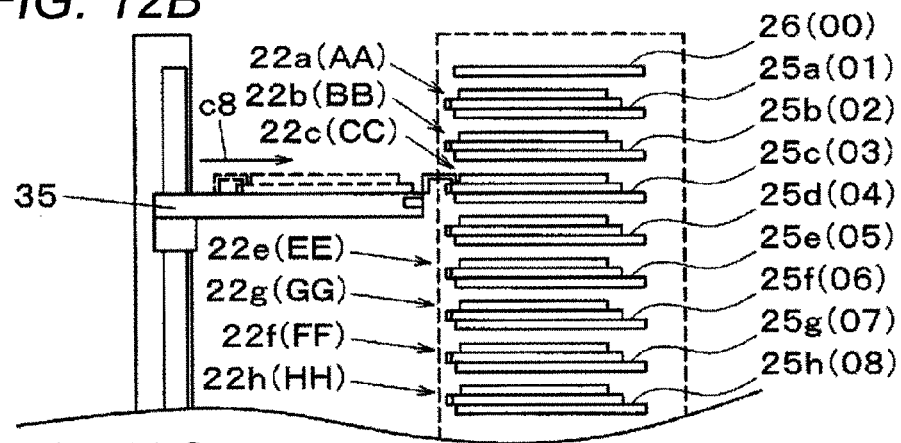

Hereinafter, the rearrangement operation performed thereafter to make the tray arrangement coincide with the first tray arrangement data 55 will be described briefly. First, as shown in FIGS. 11B and 11C, the carrier 22*d* to be placed on the tray holding shelf 25*d* having newly become empty is drawn out from the tray holding shelf 25*c* (arrow c5), and the carrier 22*d* is moved to the tray holding shelf 25*d* (arrow c6). Then, as shown in FIGS. 12A and 12B, the carrier 22*c* to be placed on the tray holding shelf 25*c* is drawn out from the temporary tray placement shelf 26 (arrow c7), and moved to the tray holding shelf 25*c* (arrow c8).

Figure 12C:
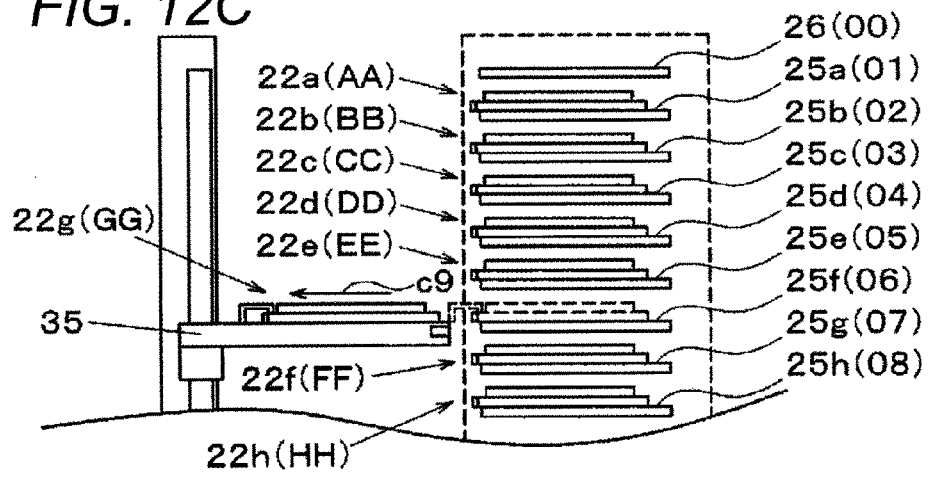
Figure 13A:
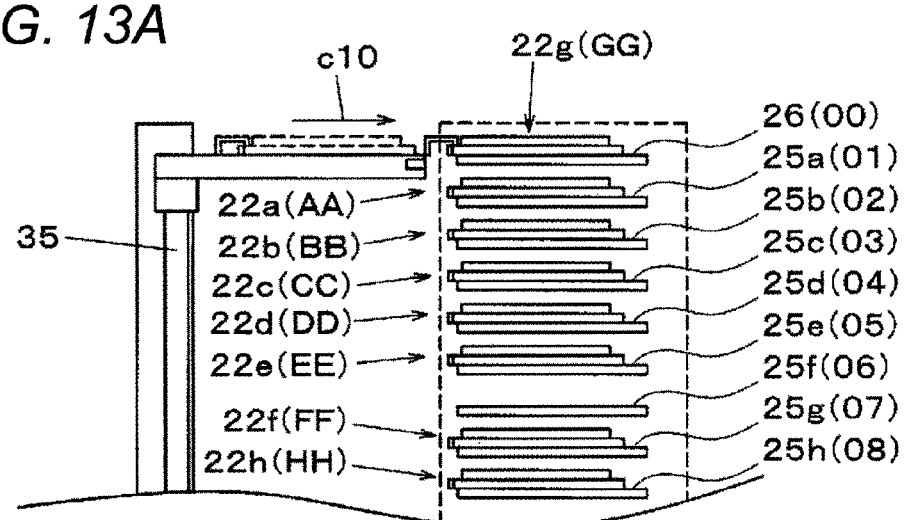
FIGS. 13A, 13B and 13C are explanatory views of the tray rearrangement operation according to the embodiment of the present invention.
Figure 13B:
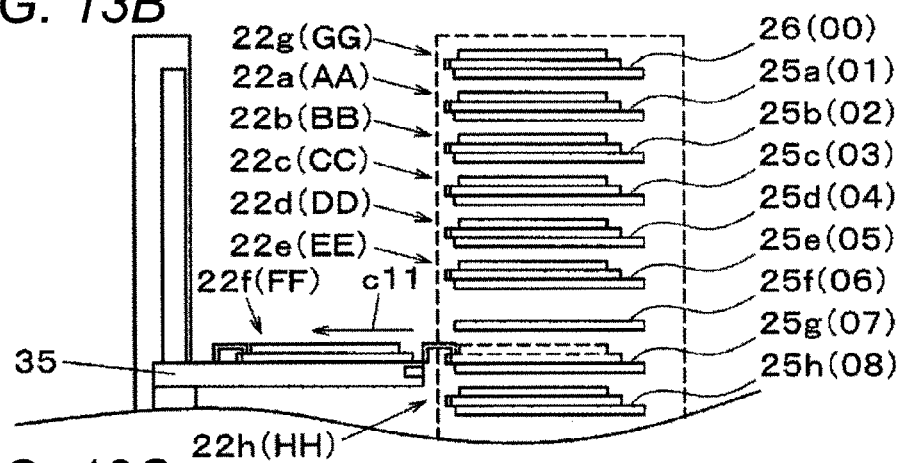
Figure 13C:
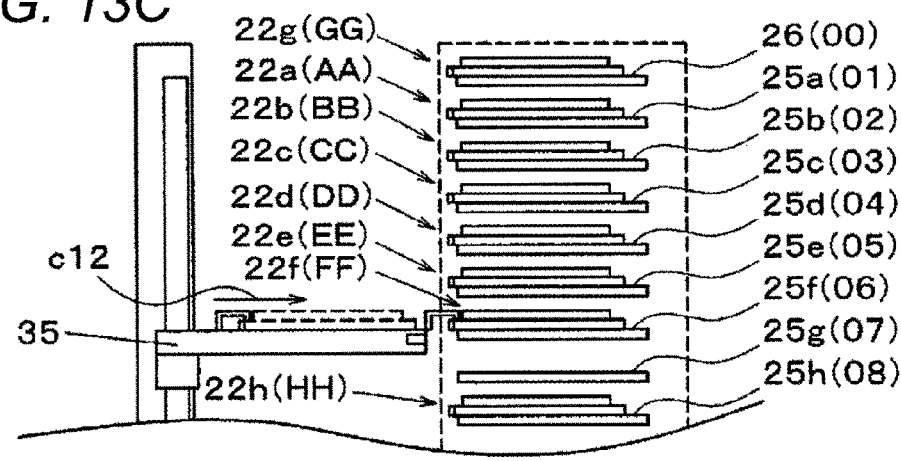
Figure 14A:
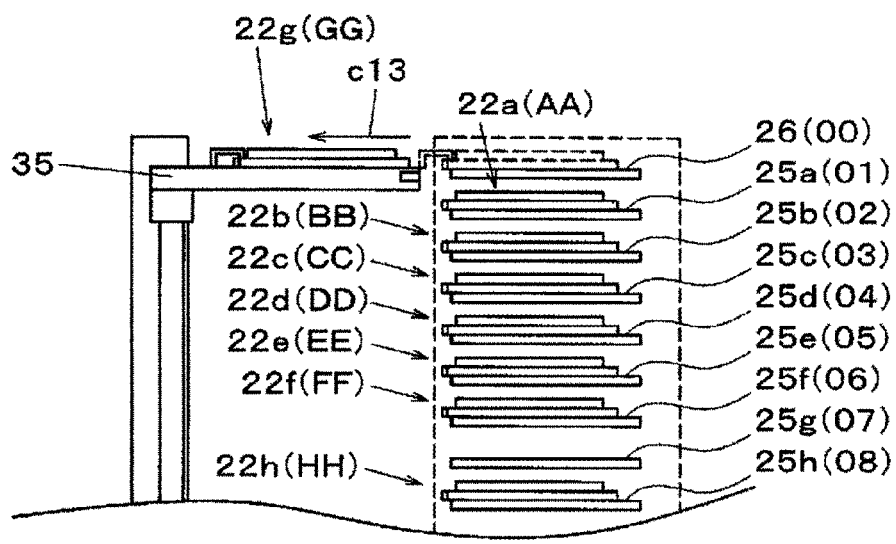
FIGS. 14A and 14B are explanatory views of the tray rearrangement operation according to the embodiment of the present invention.
Figure 14B:
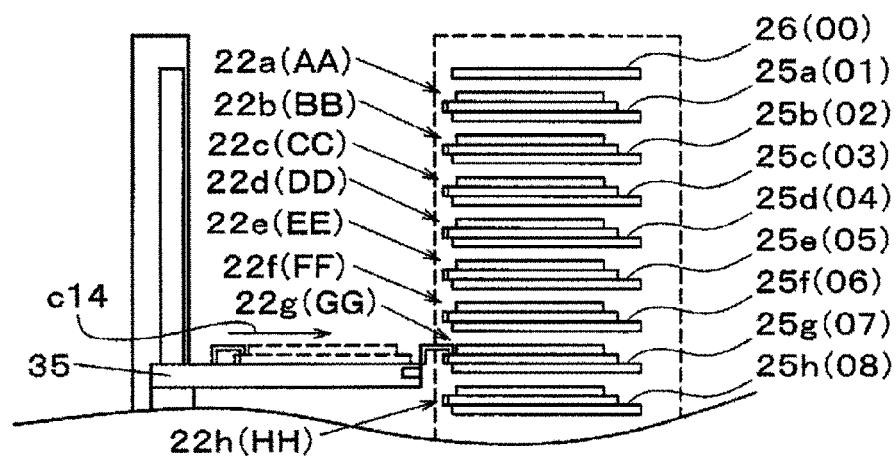

Then, as shown in FIGS. 12C and 13A, the carrier 22*g* is drawn out from the tray holding shelf 25*f* (arrow c9), and moved to the temporary tray placement shelf 26 (arrow c10). Then, as shown in FIGS. 13B and 13C, the carrier 22*f* is drawn out from the tray holding shelf 25*g* (arrow c11), and placed on the tray holding shelf 25*f* (arrow c12). Then, as shown in FIGS. 14A and 14B, the carrier 22*g* is drawn out from the temporary tray placement shelf 26 (arrow c13), and placed on the tray holding shelf 25*g* (arrow c14). Through the above-described operation, the combination data 57 and the first tray arrangement data 55 coincide with each other, and the rearrangement of the trays 23 is completed. Thereby, the tray arrangement in the tray container 21 becomes the most suitable one for the production of the board 2A.

Figure 15A:
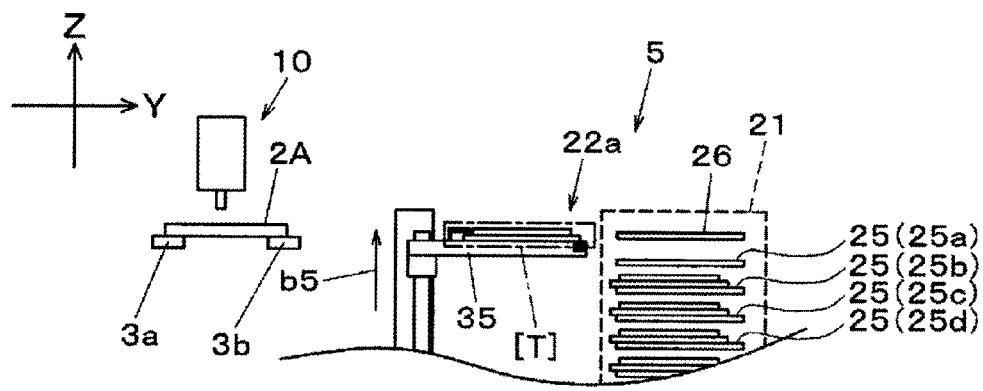
FIGS. 15A, 15B and 15C are explanatory views of an electronic component mounting operation according to the embodiment of the present invention.

After the rearrangement of the trays 23 is completed, the electronic component P is mounted on the board 2A (ST6: first electronic component mounting step). That is, as shown in FIG. 15A, the carrier 22 (carrier 22*a* in this example) held on any of the tray holding shelves 25 is drawn out onto the tray holding stage 35. Then, the tray holding stage 35 moves up to thereby move the carrier 22*a* to the component supply position [T] (arrow b5).

Figure 15B:
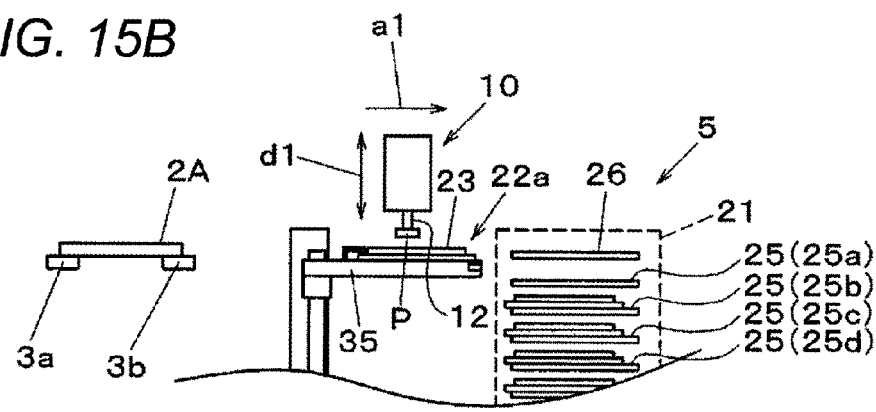
Figure 15C:
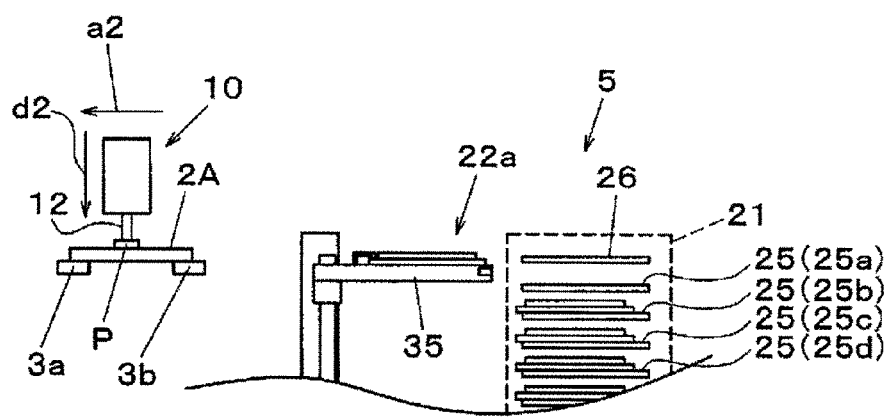

Then, as shown in FIG. 15B, the mounting head 10 moves to above the carrier 22*a* (arrow a1). Then, the suction nozzle 12 moves up and down to thereby take out the electronic component P from the tray 23 (arrow d1). Then, as shown in FIG. 15C, the mounting head 10 moves to above the board 2A positioned in the mounting work position (arrow a2). Then, the suction nozzle 12 moves down to thereby mount the electronic component P on the board 2A (arrow d2). That is, at this step, the electronic component P supplied from the tray feeder 5 after the rearrangement at the first tray rearrangement step (ST5) is mounted on the board 2A belonging to the first board type.

Thereafter, the carrier 22*a* is returned to the tray holding shelf 25*a*, and the carrier 22 storing the electronic component P to be mounted next is newly supplied to the component supply position [T]. When all the electronic components P to be mounted are mounted on one board 2A, the board 2A is conveyed to the apparatus (not shown) on the downstream side. Thereby, the production of one board 2A at the electronic component mounting apparatus 1 is completed.

Then, the feeder control unit 50 determines whether the production of all the boards 2A belonging to the first board type is finished or not (ST7: first board type production finish determination step). When it is determined that the production of all the boards 2A is not finished, the process returns to (ST5) and mounting of the electronic component P on the board 2A is performed. On the other hand, when it is determined that the production of all the boards 2A is finished, the changeover work to start the production of the boards 2B is performed. As concrete contents of the work, in addition to the rearrangement of the trays 23 described below, change of the rail width according to the boards 2B, exchange of the mounting head 10 and the like are performed as required.

Next, the steps for producing the board 2B will be described. First, the feeder control unit 50 checks the combination data 57 and the second tray arrangement data 56 against each other (ST8: second check step), and determines whether the combination data 57 coincides with the second tray arrangement data 56 or not (ST9: second combination data determination step). The combination data 57 at this point of time coincides with the first tray arrangement data 55 (FIG. 5A, FIG. 6B). Therefore, unless the tray arrangements indicated by the first tray arrangement data 55 and the second tray arrangement data 56 are the same, it is determined at (ST9) that the combination data 57 does not coincide. Moreover, the combination data 57 may be acquired again by executing the operation of reading the IC tag 27 by the tag reader 38 before the data check at (ST8).

When it is determined that the combination data 57 does not coincide with the second tray arrangement data 56, the feeder control unit 50 rearranges the trays 23 so that the combination data 57 and the second tray arrangement data 56 coincide with each other (ST10: second tray rearrangement step). That is, at this step, before the start of production of the board 2B belonging to the second board type, the trays 23 in the tray feeder 5 are rearranged to the tray arrangement corresponding to the second tray arrangement data 56 based on the second tray arrangement data 56, prepared in advance, adapted for the production of the board 2B belonging to the second board type.

In this example, in the combination data 57 shown after the finish of production of the board 2A, only the combination of the address number 05 and the identification information (EE) of the tray 23 coincides with the second tray arrangement data 56 (FIG. 5B, FIG. 6B). Although it is therefore necessary to rearrange the trays 23, since the concrete rearrangement operation is similar to the one described with respect to the board 2A, a detailed description thereof is omitted. By executing this step, the tray arrangement in the tray container 21 becomes the most suitable one for the production of the board 2B.

After the rearrangement of the trays 23 is finished, the electronic component P is mounted on the board 2B (ST11: second electronic component mounting step). That is, the electronic component P supplied from the tray feeder 5 where the rearrangement has been performed at the second tray rearrangement step (ST10) is mounted on the board 2B belonging to the second board type. A detailed description of the concrete mounting operation is omitted since it is similar to the one described with respect to the board 2A.

Thereafter, the feeder control unit 50 determines whether the production of all the boards 2B is finished or not (ST12: second board type production finish determination step). When it is determined that the production of all the boards 2B is not finished, the process returns to (ST11) and mounting of the electronic component P on the board 2B is performed. On the other hand, when it is determined that the production of all the boards 2B is finished, the production of the boards 2B is ended.

As described above, with the electronic component mounting apparatus 1 of the present embodiment, the number of times of work for the operator to place the trays 23 in the tray feeder 5 can be reduced in a mode where a plurality of board types are continuously produced. That is, in the electronic component mounting apparatus 1, before the start of production of the board 2A belonging to the first board type, in addition to the tray 23 storing the electronic component P to be mounted on the board 2A, the tray 23 storing the electronic component P to be mounted on the board 2B belonging to the second board type is placed on the tray holding shelf 25. For this reason, in the changeover work performed after the finish of production of the board 2A belonging to the first board type, the work of placement of the trays 23 by the operator to produce the second board type is unnecessary. Consequently, the number of times of placement of the trays 23 in the tray feeder 5 can be reduced to reduce the operator's time and labor required for the work of placement of the trays 23.

Moreover, when a plurality of board types are continuously produced, before the start of mounting of the electronic component P on, of a plurality of boards 2 belonging to the board types, the board 2 produced first, the tray arrangement in the tray container 21 is automatically rearranged to the most suitable one for the production of the board 2 belonging the board type thereof. Consequently, productivity can be improved in the mode where a plurality of board types are continuously produced.

The present invention is not limited to the embodiment described above and may be modified without departing from the scope of the invention. For example, the first tray arrangement data 55 and the second tray arrangement data 56 may be stored in the storage unit 41 of the main control unit 40. Moreover, one of a plurality of tray feeders 5 may be changed to a tape feeder that supplies electronic components by pitch-feeding a carrier tape storing the electronic components. Moreover, a bar code may be used instead of the IC tag 27, and different devices such as a bar code reader may be used instead of the tag reader 38.

Moreover, while the boards 2 to be produced are two types of the first board type and the second board type in the present embodiment, three or more types where a third board type is added may be the objects of production. In this case, after the finish of production of the second board type, rearrangement of the trays 23 suitable for the production of the third board type is performed, and then, mounting work is performed. That is, the electronic components P may be mounted on a plurality of board types including at least the first board type and the second board type by using the electronic component mounting apparatus 1 according to the present embodiment.

According to the embodiment of the present invention, the number of times of placement of the trays in the tray feeder by the operator can be reduced and the most suitable tray arrangement can be realized according to a plurality of board types, so that productivity can be improved. Thus, the embodiment of the present invention is particularly useful in the field of electronic component mounting.

What is claimed is:

1. An electronic component mounting method for mounting an electronic component on boards of a plurality of board types including a board belonging to a first board type and a board belonging to a second board type that are operatively associated with an electronic component mounting apparatus, said method comprising:

providing the electronic component mounting apparatus that comprises: a tray feeder for supplying the electronic component, the tray feeder including a tray container housing a plurality of tray holding shelves arranged in a vertical direction and each of the plurality of tray holding shelves holding a tray storing the electronic component; and an electronic component mounting unit that mounts the electronic component supplied from the tray feeder, on the boards of the plurality of board types;

placing, on the tray holding shelves, a plurality of trays each storing the electronic component to be mounted on the board belonging to the first board type and a plurality of trays each storing the electronic component to be mounted on the board belonging to the second board type;

recognizing on which tray holding shelf the trays are placed, by reading identification information from a recording medium provided in each of the trays held on the tray holding shelves;

rearranging the trays in the tray feeder to a first tray arrangement corresponding to first tray arrangement data adapted for production of the board belonging to the first board type, based on recognized placement position of the trays and the first tray arrangement data, before start of production of the board belonging to the first board type; and rearranging the trays in the tray feeder to a second tray arrangement corresponding to second tray arrangement data adapted for production of the board belonging to the second board type, based on the second tray arrangement data, before start of production of the board belonging to the second board type.

2. The electronic component mounting method according to claim 1, further comprising:

mounting the electronic component supplied from the tray feeder after the rearrangement to the first tray arrangement on the board belonging to the first board type, and mounting the electronic component supplied from the tray feeder after the rearrangement to the second tray arrangement on the board belonging to the second board type.

* * * * *